(12) United States Patent
Korsunsky et al.

(10) Patent No.: US 6,685,485 B2
(45) Date of Patent: Feb. 3, 2004

(54) ELECTRICAL CONNECTOR

(75) Inventors: Iosif R. Korsunsky, Harrisburg, PA (US); Kevin E. Walker, Hershey, PA (US); Joanne E. Shipe, Harrisburg, PA (US); Wei-Chen Lee, Harrisburg, PA (US); Tod M. Harlan, Mechanicsburg, PA (US); Robert W. Brown, Harrisburg, PA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/214,014

(22) Filed: Aug. 6, 2002

(65) Prior Publication Data

US 2003/0171012 A1 Sep. 11, 2003

Related U.S. Application Data

(63) Continuation-in-part of application No. 10/104,832, filed on Mar. 22, 2002, and a continuation-in-part of application No. 10/094,499, filed on Mar. 7, 2002.

(51) Int. Cl.[7] .............................................. H01R 12/20
(52) U.S. Cl. ........................... 439/79; 439/108; 439/701
(58) Field of Search ........................... 439/79, 108, 101, 439/701, 247

(56) References Cited

U.S. PATENT DOCUMENTS

| | | | | | |
|---|---|---|---|---|---|
| 5,292,265 A | * | 3/1994 | Chen et al. | ................. | 439/326 |
| 5,320,541 A | * | 6/1994 | Korsunsky et al. | ............ | 439/79 |
| 5,813,871 A | * | 9/1998 | Grabbe et al. | ............... | 439/108 |
| 5,893,764 A | * | 4/1999 | Long | .............................. | 439/79 |
| 5,895,278 A | * | 4/1999 | Humphrey | ................... | 439/101 |
| 6,152,742 A | * | 11/2000 | Cohen et al. | ................ | 439/108 |
| 6,179,629 B1 | * | 1/2001 | Lai et al. | ....................... | 439/79 |
| 6,231,355 B1 | * | 5/2001 | Trammel et al. | .............. | 439/79 |
| 6,296,496 B1 | * | 10/2001 | Trammel | ...................... | 439/79 |
| 6,312,265 B1 | * | 11/2001 | Mohtar et al. | ................. | 439/79 |
| 6,431,883 B2 | * | 8/2002 | Pan | .............................. | 439/79 |
| 6,447,310 B1 | * | 9/2002 | Brown | ........................ | 439/108 |
| 6,464,537 B1 | * | 10/2002 | Letourneau et al. | ......... | 439/108 |

* cited by examiner

*Primary Examiner*—Gary Paumen
(74) *Attorney, Agent, or Firm*—Wei Te Chung

(57) ABSTRACT

An electrical connector (1) straddle-mounted on an edge (20) of a printed circuit board (2) includes an insulative housing (10) having an elongated groove (11) for mating. A plurality of receiving channels (13) each used to receive a support subassembly (3) is formed adjacently to and communicated with the mating groove (11). The support subassembly (3) includes a base (30) with signal contacts (5) and a ground member (4) attached thereon. Every contact (5) includes an engaging end (51) exposed to the mating groove (11) and a tail end (52) extending out of the receiving channel (13) in a suspended status. And the ground member (4) includes a plurality of contacting legs (42) extending from the ground member (4) and being arranged to stagger with the tail end (52) of every contact (5) along the lengthwise of the connector (1). Several holding elements (43) are formed in a hook shape on one edge side of the ground member (4) to hook and be partially inserted into the apertures (22) formed on the housing (10) to stop further insertion of the support subassembly (3), and the holding elements (43) of the neighboring ground member (4) are inserted in the same apertures (22) so that they can establish a common ground path to reduce their needed contacting legs (42) to the printed circuit board (2).

5 Claims, 7 Drawing Sheets

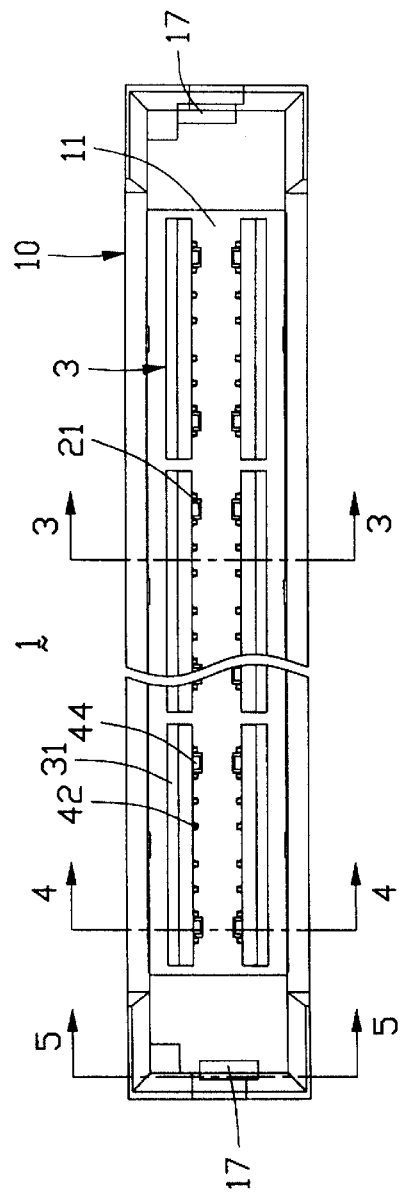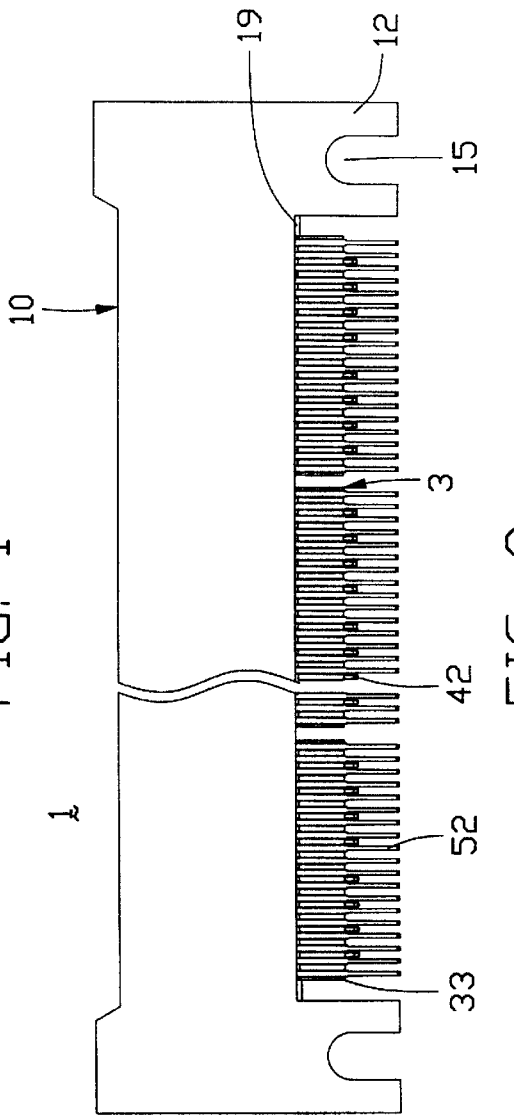

ELECTRICAL CONNECTOR

CROSS REFERENCE TO RELATED APPLICATIONS

This application is a continuation-in-part (CIP) of U.S. patent application Ser. No. 10/094,499, filed on Mar. 7, 2002, entitled "PRINTED CIRCUIT BOARD FOR STRADDLE MOUNT ELECTRICAL CONNECTOR AND METHOD FOR PASTING THE SAME", and U.S. patent application Ser. No. 10/104,832, entitled "ELECTRICAL CONNECTOR", filed on Mar. 22, 2002. The disclosure of the above identified applications is incorporated herein by reference.

BACKGROUND OF THE INVENTION

1. Field of the Invention

The present invention is related to an electrical connector, especially to a straddle mount connector which is straddle-mounted on an edge of a printed circuit board with independent support subassemblies carrying signal and grounding conductors thereon.

2. Description of the Related Art

A right-angled connector is straddle mounted on the edge of a printed circuit board to save space on the printed circuit board and facilitate the installation of some larger peripheral devices. The contacts of a right angle connector can be soldered after their right-angled tails extend through penetrated holes disposed in the printed circuit board or as a surface mount, directly on the surfaces of the printed circuit board. The through-hole type soldering will occupy space on both sides of the printed circuit board, results in limited soldering space for more and more circuits or electronic parts. The corresponding mounting and soldering process for the through-hole type soldering is complicated and time consuming because right-angle shaped tails of these contacts need to be positioned by a spacer before they are inserted into the holes of the printed circuit board and held in position by board locks before soldering proceeds. Surface-mount type soldering has a simpler and faster process, though board locks are still needed. Tails of surface mount contacts extending straightly out of the housing of the connector can be soldered on either one or two sides of the printed circuit board. Long U.S. Pat. No. 5,893,764 and Chen et al. U.S. Pat. No. 5,292,265 both introduce connectors having two rows of contacts where contacts of one row are engaged on one side of the printed circuit board while contacts of the other row are engaged on the opposite side. However, more rows of contacts are usually adopted in current connector designs for high density and high frequency applications, and sometimes a grounding means is needed to suppress generated noise between these parallel-arranged contacts. Cohen et al. U.S. Pat. No. 6,152,742 and Grabbe et al. U.S. Pat. Nos. 5,320,541 and 5,813,871 all introduce a straddle mount connector having a grounding plate disposed between two rows of contacts. Usually, the grounding means has tails extending to be soldered onto the same edge of the printed circuit board to establish electrical grounding paths. An arrangement of signal contacts and the ground means that provides good electrical performance inside the connector housing should also be helpful for both assembling and mounting processes. In the Grabbe design mentioned above, tails of the grounding plate are inserted into holes disposed on the edge side of the printed circuit board. Obviously, additional and specialized parts are needed in this application, which may cause some difficulty in the manufacturing processes and unnecessary cost.

Furthermore, spreading soldering pads on the same surface of the printed circuit board into two rows is desired to simplify the soldering process of the straddle mount connector as mentioned above because the distance between two neighboring pads can be enlarged to avoid solder wicking. Mohtar et al. U.S. Pat. No. 6,312,265 and Humphrey U.S. Pat. No. 5,895,278 show two kinds of staggered tail arrangement for solder tails on either one or two sides of a printed circuit board. However, space on the printed circuit board is unnecessarily occupied and fewer contacts can be soldered on limited pads disposed thereon in Mohtar's design. Conversely, the Humphrey's design utilizes complicated contact tails which are hard to manufacture and be positioned on the right pads of the printed circuit board. It will make both of these two designs much more complicated if any grounding means is taken into consideration in the high-speed transmission.

SUMMARY OF THE INVENTION

Therefore, an object of the present invention is to provide a straddle mount connector having simple and facilely assembled parts to form a symmetrical electrical conductor arrangement in the connector for faster production and cost saving.

Another object of the present invention is to provide a straddle mount connector having connected ground reference between different rows of high-speed transmission signal contacts in order to get better electrical performance and be in need of fewer tails mounted onto the printed circuit board where the connector is straddle mounted.

Another object of the present invention is to provide a straddle mount connector having a staggered arrangement for solder tails of signal parts and ground parts that no complex structure of contact tails or processing of the engaged printed circuit board is needed, and the final solder joints of connector tails and pads on the board are stronger because the solder paste on any pad is not damaged by other connector tails unnecessarily passing through the pad before soldering.

Another object of the present invention is to provide a straddle mount connector having conductor modules firmly installed therein which keep the signal and ground conductors mounted thereon in position while the connector is straddle mounted on a printed circuit board or mated with a complementary connector.

To obtain the above objects, an electrical connector straddle-mounted on an edge of a printed circuit board includes an insulative housing having an elongated groove for mating. A plurality of receiving channels, each of which is used to receive a support subassembly, are formed adjacently to and communicated with the mating groove. The support subassembly includes a plane-like base having a plurality of parallel arranged passageways formed on one surface of the base and a protrusion formed on the other. Pin-like signal contacts are inserted into the passageways respectively along the surface of the base and a plate-like ground member is installed abutting against the other surface of the support subassembly to be fixed on the protrusion. Every contact includes an engaging end exposed to the mating groove once the contact is inserted into the housing accompanying the support subassembly, and a tail end extending out of the receiving channel in a suspended status. And the ground member includes a plurality of contacting legs extending away from the ground member for a predetermined distance and being suspended similar to the tail end of every contact.

Specifically, the support subassemblies are installed into the connector housing in a symmetrical arrangement with every two support subassemblies received in two adjacent receiving channels of different rows being arranged reversely to have tail ends of their contacts and contacting legs of their ground member facing toward each other respectively to form a space between them for holding the edge of the printed circuit board therein. Thus, no matter how many contacts are in a row in the connector, the support subassemblies used in the connector are same that can be made easily and have lower cost. And every row of contacts can have their own accessible ground reference in the same support subassembly for effectively reducing crosstalk between these contacts. A bar portion transversely is formed protruding from one surface of the base having passageways. Several holding elements are formed in a hook shape on one edge side of the ground member. Tabs are sheared out of predetermined locations of the middle portion of the ground member and extend laterally in a predetermined length along a direction reverse to the pointing direction of the hook end of the holding element. Thus, the bar portion, holding elements and a protrusion formed on the other surface of the base are all used to stop the insertion of the support subassembly when it is assembled into the housing. And the tabs can be locked in the connector housing to prevent from the reverse movement of the support subassembly. Therefore, all of the support subassemblies with conductors, the contacts and ground member installed thereon, are firmly disposed in the connector housing for perfect engagement of these conductors while the connector is installed on a printed circuit board or mated with a complementary connector.

In addition, every holding element of the ground member will be formed toward the center of the housing and hook into a corresponding aperture formed on the housing. And the corresponding holding elements of two neighboring ground members, installed on two adjacent support subassemblies, are inserted in common apertures respectively, to become electrically connected so that these two electrically connected grounds member can establish a common ground path to the printed circuit board and let their neighboring signal contacts achieve better electrical performance when they are coupled with the connected ground members. Thus, the number of ground tails needed to engage with the printed circuit board where the connector is straddle mounted become less and the edge of the printed circuit board does not require machining for specific connection, but disposed with simple solder pads on both of its sides.

Furthermore, contacting legs of the ground member and tail ends of contacts all extend outside of the connector housing and their free ends used for electrical engagement with the printed circuit board are arranged in two different rows parallel to the lengthwise direction of the connector respectively because of their different lengths and inclined shapes. And the contacting legs of the ground member and tail ends of contacts are staggered with each other along the length of the connector. Thus, the tail ends of contacts do not pass over the ground pads of the printed circuit board used to engage with the ground member and damage preset solder paste thereon when the connector is installed onto the printed circuit board, so that the final solder joints of the connector tails and ground pads are more uniform.

Other objects, advantages and novel features of the invention will become more apparent from the following detailed description of the present embodiment when taken in conjunction with the accompanying drawings.

BRIEF DESCRIPTION OF THE DRAWINGS

FIG. 1 is a mating side plan view of an electrical connector in accordance with the present invention;

FIG. 2 is a lengthwise side plan view of the electrical connector in accordance with the present invention;

DESCRIPTION OF THE PREFERRED EMBODIMENT

Figure 3:
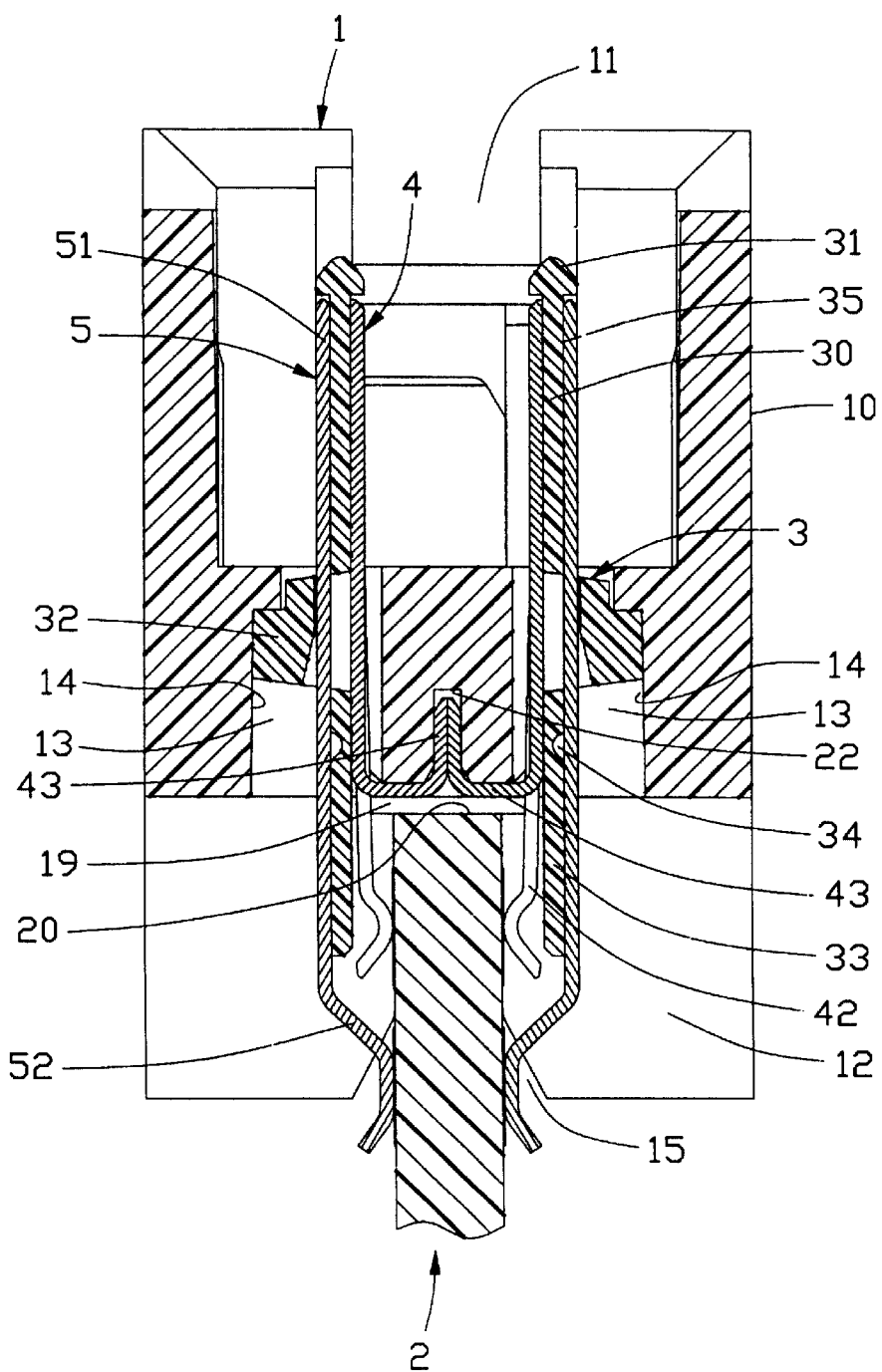
FIG. 3 is a sectional view of the electrical connector along the 3—3 line in FIG. 1 and showing the electrical connector straddle mounted on a printed circuit board.
Figure 4:
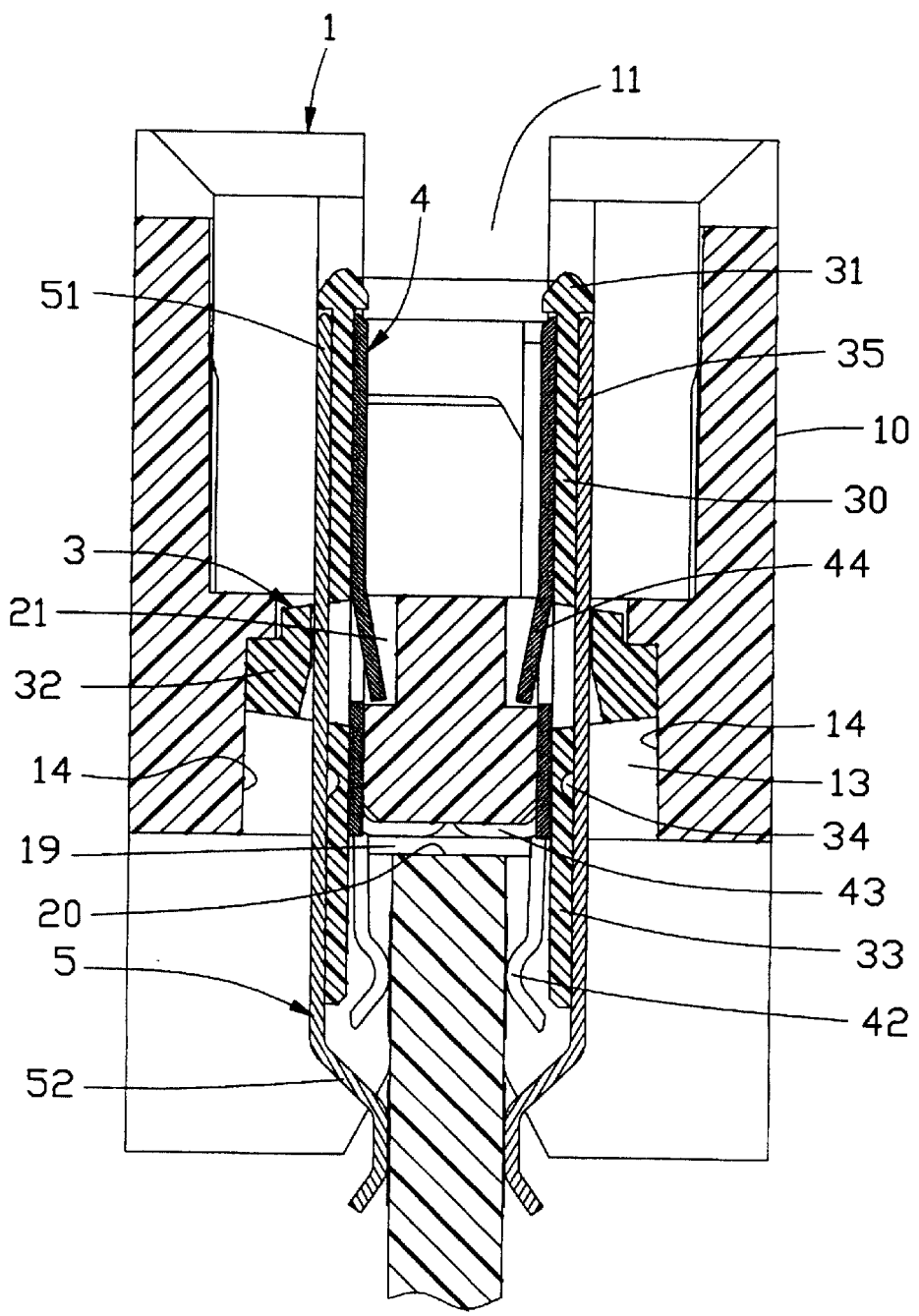
FIG. 4 is a sectional view of the electrical connector along the 4—4 line in FIG. 1 and showing the electrical connector straddle mounted on a printed circuit board.

Referring to FIGS. 1 to 3 and 5, the present invention is related to an electrical connector 1 which is straddle-mounted on an edge 20 of a printed circuit board 2. The connector 1 includes an insulative housing 10 having a mating elongated groove 11 extending along one side face of the housing 10. An even number of receiving channels 13 are formed adjacently to and communicated with the mating groove 11 and each has an opening formed on another side face opposing to the side face having the groove 11 and extending along the lengthwise direction of the opposing side face in one of two predetermined parallel rows. One inner sidewall 14 of every receiving channel 13 is sloped from it corresponding opening on the opposite side face of the housing 10 to the neighborhood of the mating groove 11. In the central portion of the housing 10 formed between every two adjacent receiving channels 13 of channel rows formed by the even number of receiving channels, several recesses 21 are formed on edges abutting both of the groove 11 and any one of the receiving channel 13 and communicated with both of them at the same time. And several apertures 22 are formed on the opposite side face of the central portion of the housing 10 away from the groove 11 and arranged in the central lengthwise line of this side face. A mounting portion 12 perpendicularly extending from the opposing side face at both distal ends of the housing 10 for a predetermined distance has a slot 15 formed parallel to the groove 11 for receiving the edge 20 of the printed circuit board 2. A standoff 19 protruding on the opposite side face and next to each mounting portion 12 is used to stop excess insertion of the edge 20 of the printed circuit board 2 into the slot 15. Meanwhile, an anchoring member 16 received in a narrow cavity 17 which is formed at each of the two distal ends of the housing 10 has a fork-shaped tail 18 extending outside of the narrow cavity 17 while the other portions of the anchoring member 16 received in the narrow cavity 17. The fork-shaped tail 18 of the anchoring member 16 can then yieldably engage with the edge 20 of the printed circuit board 2 when the edge 20 is inserted into the slot 15.

Referring to FIGS. 3 to 4 and 6 to 7, a molded support subassembly 3 with at least two kinds of conductors installed thereon, signal and ground, is inserted into and fixed in each receiving channel 13 from its corresponding opening on the opposing side face of the housing 10. The support subassembly 3 includes a plane-like base 30 having a lead-in edge portion 31 formed at one side of the base 30 and a separating portion 33 formed at the other side opposing to it. A bar portion 32 transversely protrudes from the middle part of one surface of the base 30 along its lengthwise direction. And an adjusting portion 34 with a shallow trough disposed parallel to the bar portion 32 and abutting against the separating portion 33 is used as a weakened area to facilitate and ease the adjusting or bending process for the final position of the separating portion 33. A plurality of parallel arranged passageways 35 are formed on the same surface of the base 30 where the bar portion 32 is seated and each of them passes across through and underneath the bar portion 32. A protrusion 36 is formed on the other surface of the base 30 and is inversely protruded away from the bar portion 32 right at the back of the bar portion 32. Pin-like signal contacts 5, one kind of conductors, with the same number as the passageways 35 are inserted into the passageways 35 respectively along the surface of the base 30 from the separating portion 33 side to the lead-in edge portion 31 side. These contacts 5 can be held by the bar portion 32 at their middle portions and fixed in the corresponding passageways 35 by their own barbs formed on these contacts 5. An engaging end 51 of each contact 5 stays in its corresponding passageway 35 and is exposed to the mating groove 11 when the contact 5 is inserted into the housing 10 accompanying with the support subassembly 3. And the tail end 52 of every contact 5 then extends out of the receiving channel 13 of the housing 10 and aligns with each other in rows between the mounting portions 12 formed near two ends of the housing 10 respectively. In addition, a plate-like ground member 4 is installed abutting against the other surface of the support subassembly 3 where the protrusion 36 is located. A hole 41 with two projections directed inward on its edges is formed near the center of the ground member 4 corresponding to the protrusion 36 of the base 30 and is used to fix the ground member 4 onto the base 30 by clasping the protrusion 36 in the hole 41. A plurality of contacting legs 42 are formed with portions stamped out of the ground member 4 and each has a distal end extending parallel to each other and away from the ground member 4 in a predetermined distance. Holding elements 43 are formed in a hook shape on the edge side of the ground member 4 neighboring the contacting legs 42. Each of holding elements 43 extends vertically away from the surface of the base 30 and has its distal end parallel to the surface and pointing approximately to the reverse direction of the extending direction of the contacting legs 42. Meanwhile, two, tabs 44 are formed on predetermined positions of the middle portion of the ground member 4 and sheared out of the ground member 4 to extend laterally in a predetermined length along the similar extending direction of the contacting legs 42.

Figure 8:
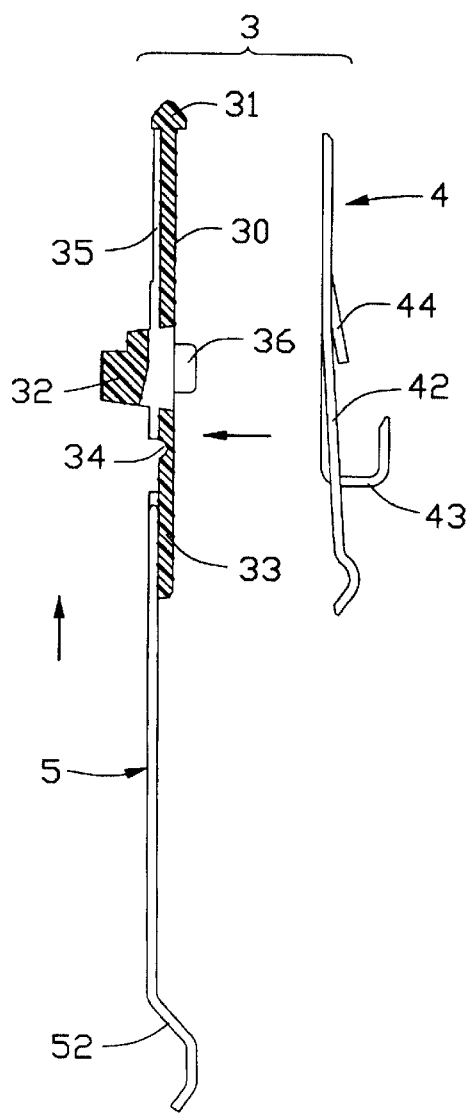
FIG. 8 is a schematic sectional view of the support subassembly of the electrical connector in accordance with the present invention showing the assembling method of the signal contacts and the ground member.
Figure 9:
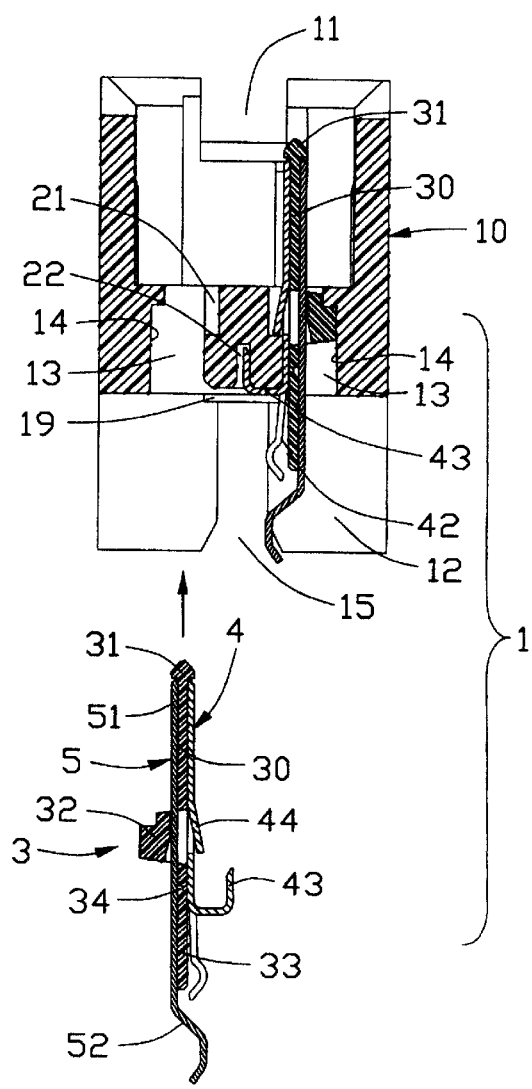
FIG. 9 is a schematic sectional view of the electrical connector in accordance with the present invention showing the assembling method of the support subassembly.

Referring to FIGS. 8 and 9, while assembling, signal contacts 5 are inserted into their corresponding passageways 35 respectively along the surface of the base 30 and each is held at its middle portion by the bar portion 32. And then the ground member 4 is positioned on the other surface of the base 30 by latching the central hole 41 on the protrusion 36 of the base 30 to form a complete support subassembly 3. Every portion of the ground member 4 is electrically insulated from the contacts with the base 30 including the suspended contacting leg 42 which is isolated from the neighboring tail ends of contacts by the separating portion 33 of the base 30. Every support subassembly 3 is then inserted into the housing 10 from the corresponding opening of the receiving channel 13. And two support subassemblies 3 received in two adjacent receiving channels 13 of different rows are reversely and symmetrically arranged to have tail ends 52 of their contacts 5 and contacting legs 42 of their ground member 4 facing toward each other respectively to form a space between them for holding the edge 20 of the printed circuit board 2 therein. Additionally, at the very beginning of insertion of each support subassembly 3 into the housing 10, the bar portion 32 of the support subassembly 3 is engaged upon the sidewall 14 of the receiving channel 13 while the tabs 44 of the ground member 4 are engaged with and slide along the surface of the central portion of the housing 10 opposite to the sidewall 14. Due to the sloped surface of the sidewall 14, the support subassembly 3 is pushed toward the opposite surface and tabs 44 are pressed inward, toward the base 30 until the bar portion 32 is stopped at the end of the sidewall 14 and tabs 44 reach their corresponding recesses 21 of the central portion of the housing 10 to latch therein. Simultaneously every holding element 43 of the ground member 4 will move close to the opposite side face of the housing 10 in order to hook and be partially inserted into the apertures 22 formed on the housing 10 to stop further insertion of the support subassembly 3. The plate portion of the ground member 4 and engaging ends 51 of contacts 5 are then inserted accompanying with the support subassembly 3 into the mating groove 11 and exposed therein as parts of the mating interface. The ground members 4 of two neighboring support subassemblies 3 are placed between two rows of high-speed transmission signal contacts 5 as their ground reference to reduce crosstalk introduced between every two signal contacts 5. And their corresponding holding elements 43 are inserted in the same apertures 22 to become electrically connected so that these two electrically connected ground members 4 can establish a common ground path to the printed circuit board 2 and let the related signal contacts 5 achieve better electrical performance when they are coupled with the connected ground members 4.

Figure 5:
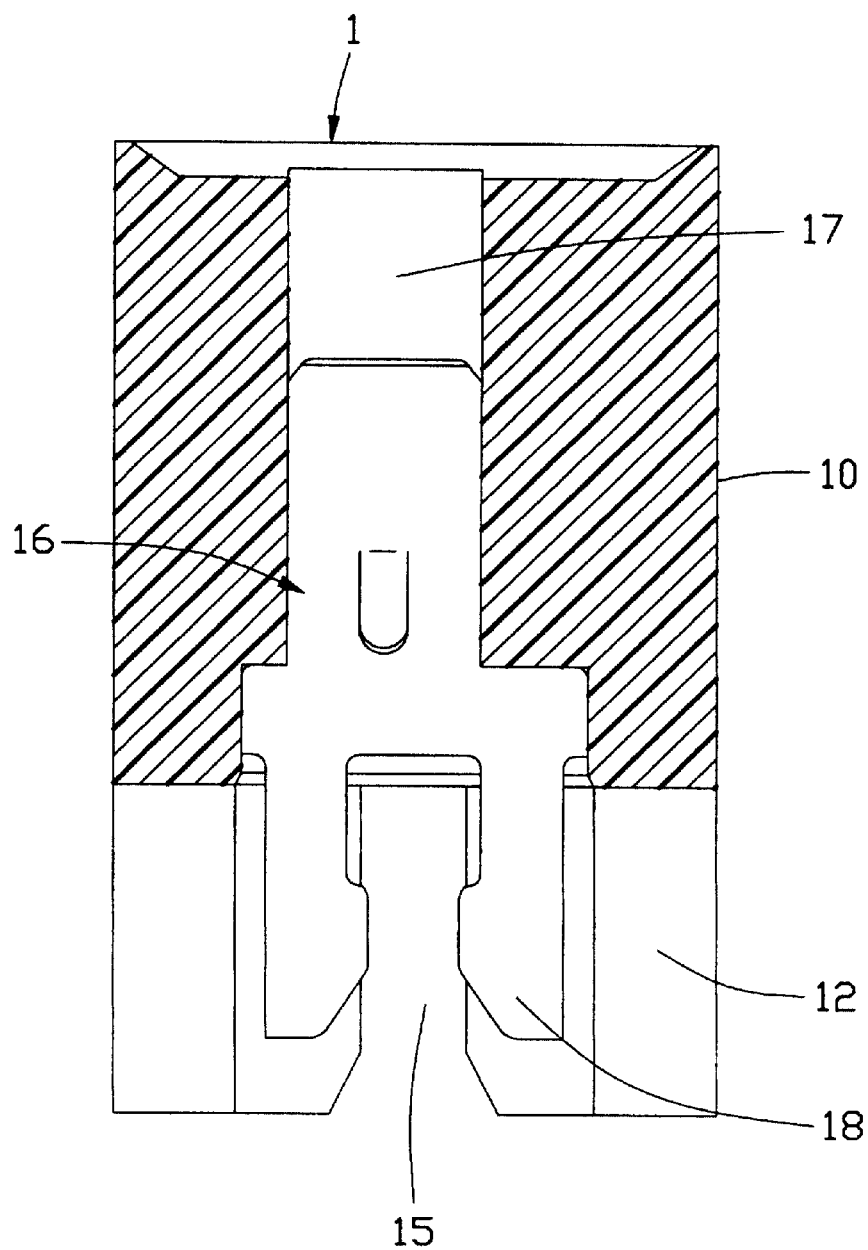
FIG. 5 is a sectional view of the electrical connector showing its anchoring member used to fix the electrical connector onto the printed circuit board in accordance with the present invention along the 5—5 line in FIG. 1.
Figure 6:
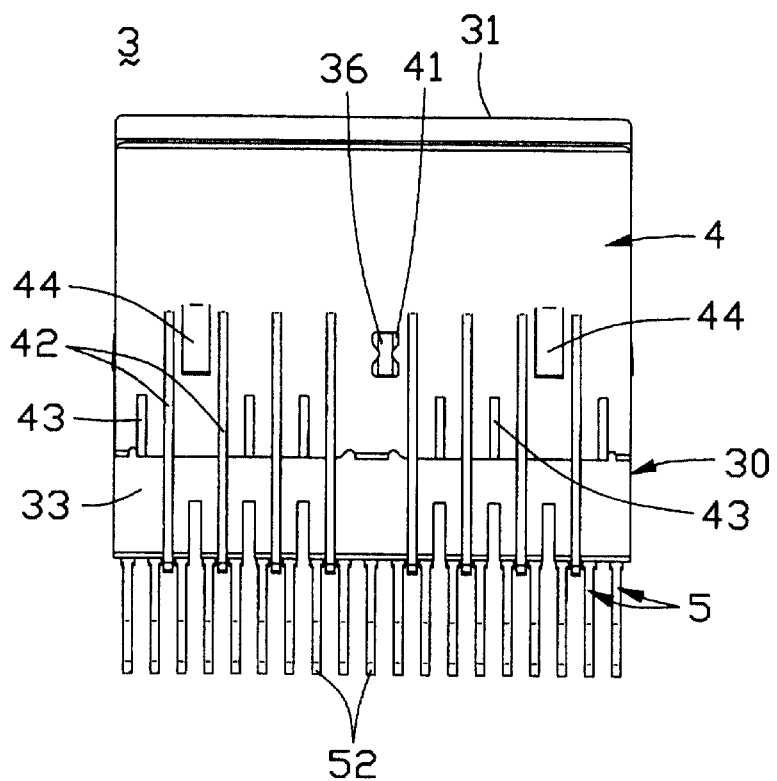
FIG. 6 is a longitudinal side view of the support subassembly of the electrical connector in accordance with the present invention showing the assembled ground member.
Figure 7:
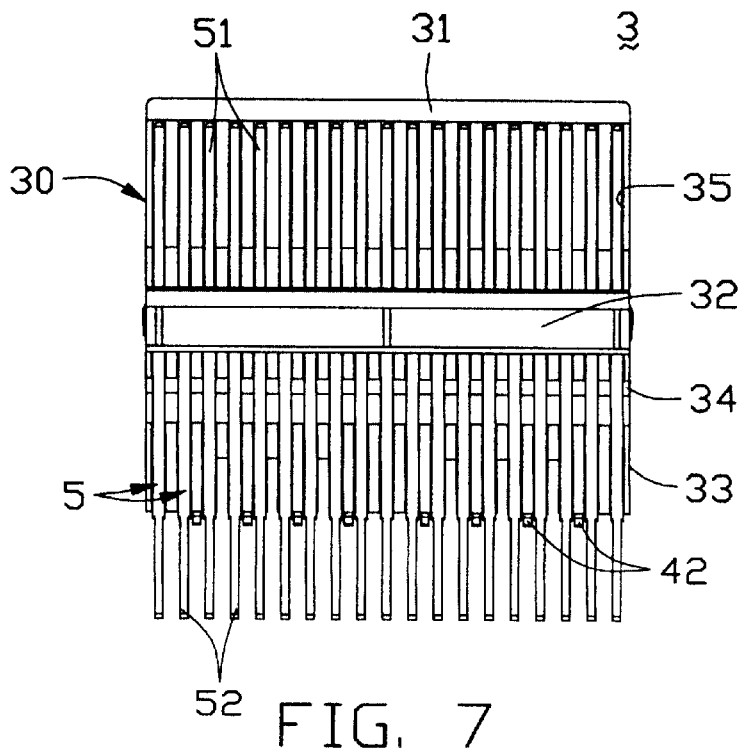
FIG. 7 is a longitudinal side view of the support subassembly of the electrical connector showing the other side of the support subassembly where the signal contacts are assembled.
Figure 10:
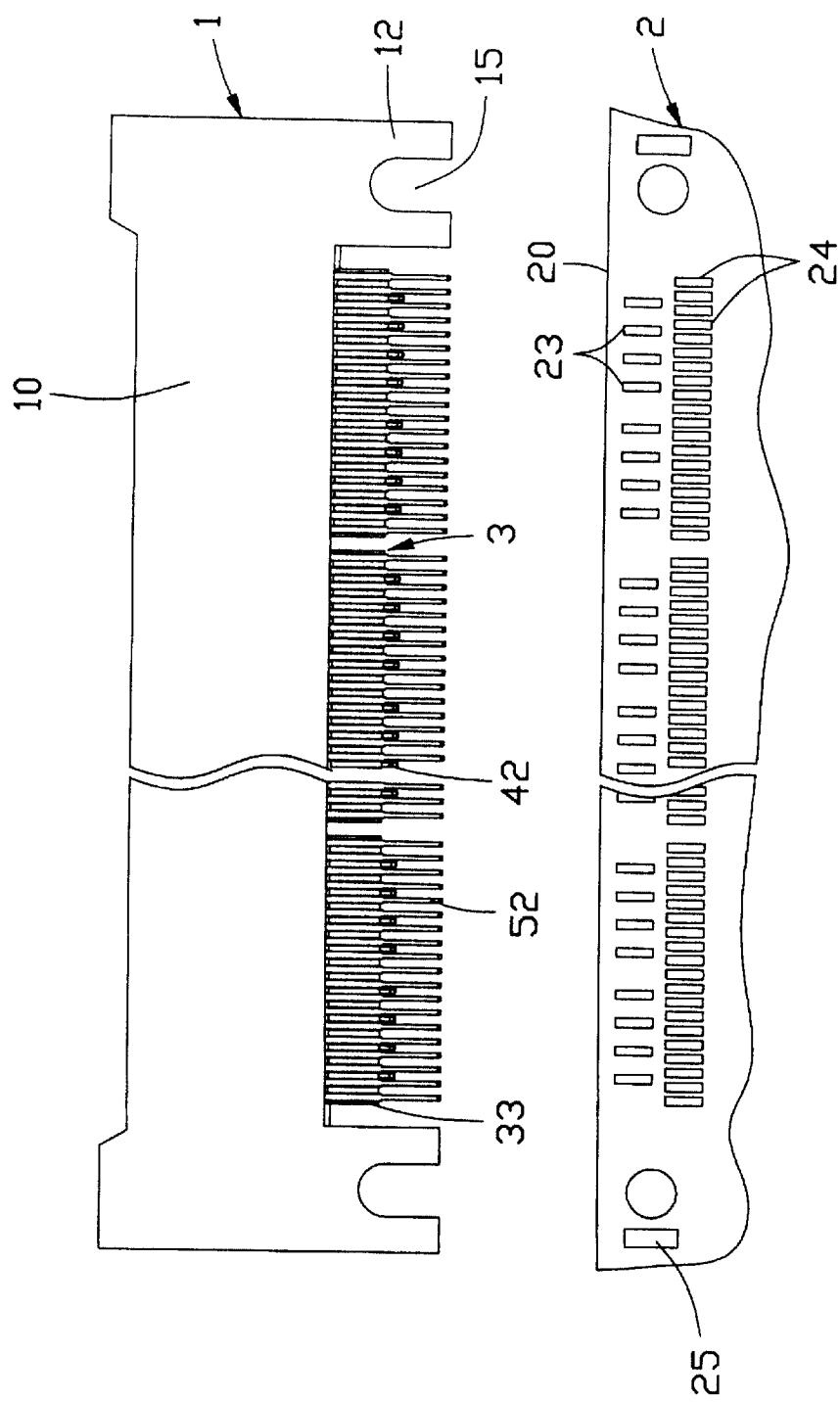
FIG. 10 is a schematic side view of the electrical connector in accordance with the present invention showing the electrical connector before it is mounted on a printed circuit board which has a staggered arrangement of signal pads and ground ones thereon.

Additionally, referring to FIGS. 3, 5 and 10, contacting legs 42 of the ground member 4 and tail ends 52 of contacts 5 all extend outside of the housing 10 and their free ends used for electrical engagement are arranged in two different rows parallel to the lengthwise direction of the housing 10 respectively because of their different lengths and inclined shapes. The separating portion 33 of the base 30 remains staying outside of the housing 10 to separate the contacting legs from the tail ends 52. It is understood these engagement free ends of contacts 5 and the ground member 4 will be used to engage with two corresponding rows of ground and signal pads 23, 24 respectively formed near the edge 20 of the printed circuit board 2. And the anchoring member 16 installed at each end of the housing 10 can clamp on a contacting pad 25 for the printed circuit board 2 for solderless or solderable engagement. To prevent from the undesired plow or damage of solder paste on every pad 23, 24, especially solder paste on the ground ones 23, the contacting legs 42 of the ground member 4 and tail ends 52 of contacts 5 are staggered with each other. Thus, the tail ends 52 of contacts 5 do not pass over any one ground pad 23 and damage preset solder paste thereon when the connector 1 is installed onto the printed circuit board 2. Finally, the separating portion 33 is useful to electrically isolate the free contacting legs 42 and tail ends 52 from each other to prevent a short circuit during either the assembly process of the support subassembly 3 or the installation process onto the printed circuit board 2.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector straddle mounted on a printed circuit board comprising:

a housing having a mating groove to receive portions of a mating connector;

at least two support subassemblies with a plurality of signal contacts and ground members disposed thereon being inserted into the housing and extending into the mating groove to expose a mating portion of each contact or ground member in the mating groove while a tail portion of each contact or ground member is electrically engaged with the printed circuit board; wherein portions of the ground members disposed on different support subassemblies respectively are electrically connected to each other to establish a common ground path to reduce the needed numbers of the mating and tail portions of the ground members;

wherein the portion of any ground member for electrical connection to another ground member is a holding element in a hook shape formed on one edge side of the ground member;

wherein each ground member includes a plate-like member body abutting against one surface of the support subassembly to be used as the mating portion of the ground member, and a plurality of contacting legs formed with portions stamped out of the ground member body and extending parallel to each other to be used as the tail portion of the ground member;

wherein every holding element of the ground member is hooked on a side face of the housing opposite to the side face where the mating groove is formed and is partially inserted into a corresponding aperture formed on said side face while the holding element of the other connected ground member is inserted in the same aperture to electrically engage with each other.

2. An electrical connector straddle mounted on a printed circuit board comprising:

a housing having a mating side face of the housing used to mate with a mating connector and a mounting side face opposing to the mating side face abutting against one edge of the printed circuit board;

at least two support subassemblies with a plurality of signal contacts and ground members disposed thereon being installed into the housing as the main engagement parts of the connector with the mating connector and the printed circuit board; wherein portions of the ground members disposed on different support subassemblies respectively extend out of the ground members in order to electrically connect with each other and stop the further movement of the support subassemblies when the support subassemblies are installed to the predetermined positions inside the housing;

wherein the portion of any ground member for electrical connection to another ground member and stopping mechanism is a holding element in a hook shape formed on one edge side of the ground member;

wherein every holding element of the ground member is hooked against the mounting side face and is partially inserted into a corresponding aperture formed on the mounting side face.

3. An electrical connector straddle mounted on a printed circuit board comprising:

a housing having a mating side face of the housing used to mate with a mating connector and a mounting side face opposing to the mating side face abutting against one edge of the printed circuit board;

a support subassembly comprising signal-carrying conductors being inserted into the housing from the mounting side face to the mating side face in order to have one end of each conductor being exposed to the mating side face to electrically connect to the mating connector and the other end of each conductor extending from the mounting side face in a suspended status to be electrically engaged with the printed circuit board; wherein at least two fixing mechanisms are formed on the support subassembly, one of the fixing mechanisms is used to engage with a portion of the housing to prevent the support subassembly from further movement in the insertion direction of the support subassembly, and the other is used to engage with a portion of the housing to prevent the support subassembly from further movement in a reverse direction of the insertion direction after the support subassembly is assembled in a predetermined position inside the housing;

wherein the conductors of the support subassembly include a plurality of signal contacts and a plane ground member;

wherein said ground member includes several holding elements formed in a hook shape on an edge side thereof near the mounting side face in order to hook against the mounting side face as a stop in the insertion direction of the support subassembly;

wherein said ground member further includes two tabs formed on the middle portion of the ground member and extending laterally in a predetermined length to latch on a corresponding recess inside the housing as a stop in the reverse direction;

wherein the base of every support subassembly includes a bar portion transversely protruding from the middle part of one surface of the base along its lengthwise direction to be engaged within the housing as a stop in the insertion direction;

wherein the base of every support subassembly includes a protrusion formed on one surface of the base in order to be engaged within the housing as a stop in the insertion direction.

4. An electrical connector straddle mounted on a printed circuit board comprising:

a housing having a mating side face of the housing used to mate with a mating connector and a mounting side face opposing to the mating side face abutting against one edge of the printed circuit board;

a support subassembly comprising a plurality of signal contacts and ground members and being installed in the housing, each signal contact comprising an engaging end extending near the mating side face to mate with the mating connector and a tail end extending out of the housing to be electrically engaged with a corresponding pad formed on the printed circuit board, and each ground member having at least one contacting leg extending out of the housing to be electrically engaged with a corresponding pad formed on the printed circuit board; wherein the tail end of the contact and the contacting leg of the ground member are staggered with each other along the lengthwise direction of the housing so that any of the tail ends and contacting legs does not pass over other pads on the printed circuit board before it reaches its own corresponding pad when the connector is being straddle mounted on the board.

5. An electrical connector straddle mounted on a printed circuit board comprising:

a housing having a mating groove to receive portions of a mating connector;

at least two support subassemblies each having a plurality of signal contacts and at least one ground member and being installed in the housing to mate with the portions of the mating connector and electrically engage with the printed circuit board; wherein the two support subassemblies are symmetrically arranged in the mating groove so that the signal contacts of these two support subassemblies are electrically separated by any one of the ground members disposed on the support subassemblies;

wherein the ground members of said two support subassemblies include holding elements not only mutually electrically and mechanically engaged with each other but also mechanically engaged with the housing for holding the corresponding subassemblies in position in the housing;

wherein each of said subassemblies includes a base with the corresponding signal contacts and the corresponding ground member located on two opposite surfaces thereon;

wherein the ground member is sandwiched between the housing and the corresponding base, while the signal contacts are located in the base without direct engagement with the housing.

* * * * *